United States Patent

Davis et al.

[11] Patent Number: 6,160,706
[45] Date of Patent: Dec. 12, 2000

[54] RETENTION DEVICE FOR PROCESSOR MODULE WITH HEAT SINK

[75] Inventors: Wayne Samuel Davis, Harrisburg; Robert Neil Whiteman, Jr., Middletown, both of Pa.

[73] Assignee: The Whitaker Corporation

[21] Appl. No.: 09/225,599

[22] Filed: Jan. 6, 1999

Related U.S. Application Data

[60] Provisional application No. 60/073,206, Jan. 10, 1998.

[51] Int. Cl.$^7$ .................................................. A05K 7/20
[52] U.S. Cl. ......................... 361/704; 361/719; 361/785; 439/64
[58] Field of Search ................... 174/16.3; 211/41.17; 361/687, 704, 707, 709, 710, 740, 717–719, 741, 784, 785, 801, 802, 803, 756, 759; 439/62, 64, 156–160, 326–329, 629–631, 636, 637, 876

[56] References Cited

U.S. PATENT DOCUMENTS

| | | | |
|---|---|---|---|
| 3,829,741 | 8/1974 | Athey | 317/101 DH |
| 4,349,237 | 9/1982 | Cobaugh | 339/65 |
| 4,712,848 | 12/1987 | Edgley | 439/327 |
| 4,872,853 | 10/1989 | Webster | 439/327 |
| 5,267,872 | 12/1993 | Gou et al. | 439/326 |
| 5,417,580 | 5/1995 | Tsai | 439/328 |
| 5,573,408 | 11/1996 | Laub et al. | 439/62 |
| 5,726,865 | 3/1998 | Webb et al. | 361/801 |
| 5,730,611 | 3/1998 | Cheng et al. | 439/160 |
| 5,748,446 | 5/1998 | Feightner . | |
| 5,787,576 | 8/1998 | Warren . | |
| 5,829,601 | 11/1998 | Yurchenco . | |
| 5,842,880 | 12/1998 | Pei | 439/327 |
| 5,969,946 | 10/1999 | Lai . | |
| 6,038,131 | 3/2000 | Valosen . | |

FOREIGN PATENT DOCUMENTS 28 12 332 A1  10/1978  Germany ................. H05K 7/14

*Primary Examiner*—G P Tolin

[57] ABSTRACT

A module retention system including a pair of retention assemblies (32) at ends of a board-mounted receptacle connector (36) for securing a processor module (10) thereto, where the module includes a massive heat sink (12) mounted along one side thereof. Each retention assembly (32) includes a resilient member (50) secured along the base of a rigid retention member (38) and against the circuit board (20) that has portions (62,66) engageable by the module leading end (22) and by the heat sink distal end (16) to stabilize the module and to absorb looseness in the arrangement.

12 Claims, 5 Drawing Sheets

RETENTION DEVICE FOR PROCESSOR MODULE WITH HEAT SINK

This application claims the benefit of U.S. provision application No. 60/073,206, filed Jan. 10, 1998.

FIELD OF THE INVENTION

This relates to the field of electrical connectors and more particularly to components mountable to a circuit board.

BACKGROUND OF THE INVENTION

In computers and other electronic equipment, circuit boards are utilized to which are mounted numerous electrical and electronic components. Smaller circuit cards are utilized to establish electrical connections to a larger circuit board in a manner that permits removal and disconnection, by inserting an edge of the card into a receptacle connector mounted on the board and containing an array of contacts connected to circuits of the board. Contact sections of the contacts are exposed within a card-receiving cavity of the connector that engage circuit pads on the card surfaces upon card insertion. It has become useful to secure certain cards within larger modules so that components mounted on the card are protected by module covers during handling. Such modules, such as Slot 1 process modules, need to be accurately guided during mating with the receptacle connector so that the leading end of the enclosed card is accurately received into the card-receiving cavity of the connector, since the module covers inhibit accurate visual alignment of the card with the cavity. It is known to provide elongate retention members projecting from the board from ends of receptacle connectors to facilitate mating in similar situations. It is also known for such processor modules to have attached thereto a massive heat sink along one side thereof, and to secure a distal end thereof to the circuit board by a fastening assembly for stabilization.

It is desired to assure that all tolerance is eliminated between the processor module and its heat sink, and the retention members and heat sink board-fastening components, to eliminate looseness from the resulting mated assembly and stabilize the module against the effects of vibration and other movement.

It is also desired to provide a more convenient manner of securing the processor module and heat sink to the circuit board.

SUMMARY OF THE INVENTION

The present invention provides a retention system for a processor module having a heat sink secured thereto. A pair of retention assemblies are mountable to the circuit board at ends of a board-mounted receptacle connector and include guide arms and module-securing portions such as latches. The retention members of the assemblies each include an extended portion adapted to underlie the heat sink extending laterally from one side of the processor module, to assuredly hold the processor module/heat sink assembly upright upon full mounting of the processor module in the retention members and mating with the receptacle connector.

In one aspect of the present invention, each retention assembly also includes a resilient member disposed between the extended portion of the retention member and the circuit board and compressed by the retention member upon its being secured to the circuit board, and including a platform engaging and supporting a distal end of the heat sink. Each resilient member preferably includes a portion disposed at an end of the receptacle connector positioned and dimensioned to be abutted and slightly compressed by a respective end of the processor module upon becoming secured in the retention member fully mated to the receptacle connector. The resilient members absorb all looseness and tolerance between the retention members and the circuit board, and between the processor module and the retention members, thus stabilizing the processor module with its attached heat sink.

In another aspect of the present invention, each retention assembly is mountable to the circuit board by integral posts secured in mounting holes of the circuit board, thus eliminating the need for separate fastener components.

An embodiment of the present invention will now be disclosed by way of example with reference to the accompanying drawings.

DETAILED DESCRIPTION

Figure 1:
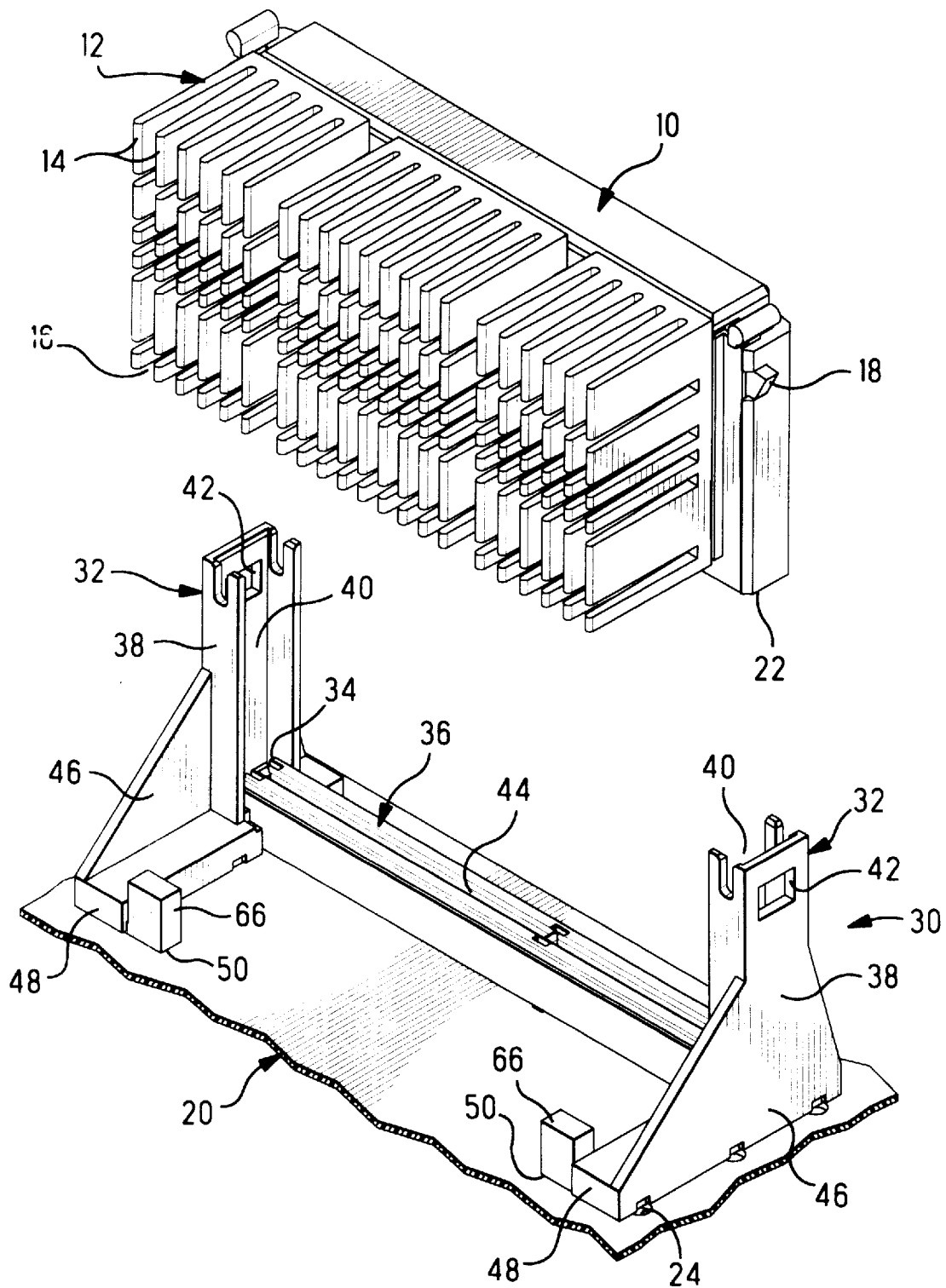
FIG. 1 is an isometric view of a processor module with attached heat sink positioned above a receptacle connector mounted on a circuit board, with retention assemblies of the present invention mounted on the board at ends of the receptacle connector.

Processor module 10 is seen in FIG. 1, having a heat sink 12 extending from one side thereof with a plurality of fins 14 that coextend a distal end 16 of the heat sink. Opposed ends of the module are seen to include respective latch projections 18 extending beyond the end surfaces. Retention system 30 of the present invention is mounted on circuit board 20, comprising a pair of assemblies 32 at opposed ends 34 of a receptacle connector 36 also mounted on the board. Retention members 38 coextend from the board at ends 34 of connector 36 defining guide channels 40 for receipt therealong of the opposed end portions of processor module 10. Openings 42 at upper ends of guide channels 40 cooperate with latch projections 18 to latchingly secure the module in position when fully inserted into the retention members and for a leading edge portion of a circuit card (not shown) within the open leading end 22 of the module to become mated with contacts (not shown) along the card-receiving slot 44 of receptacle connector 36. Such retention members in general are described in greater detail in U.S. patent application Ser. No. 08/063,127 filed Apr. 20, 1998 and assigned to the assignee hereof.

Figure 5:
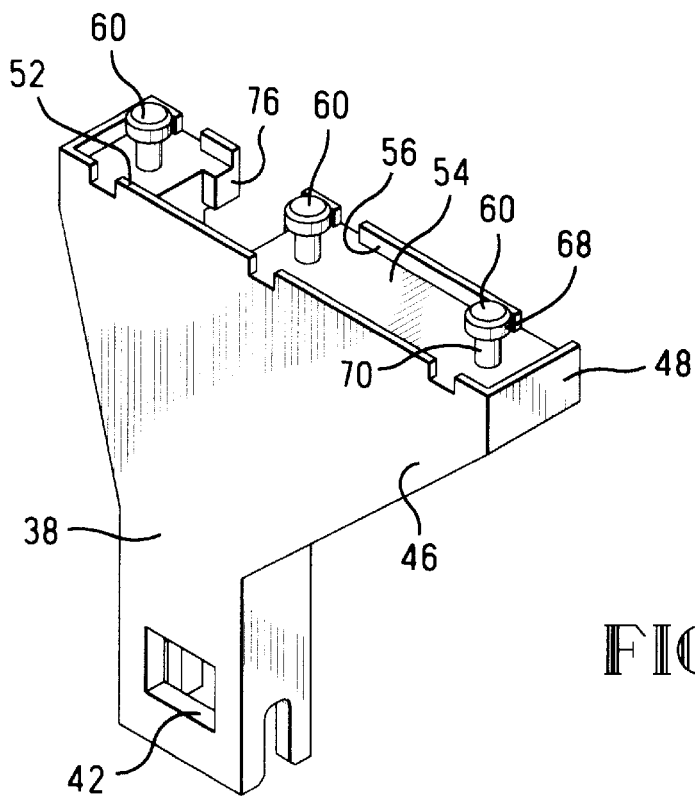
FIG. 5 is an isometric bottom view of the retention member of FIGS. 1 to 4.
Figure 6:
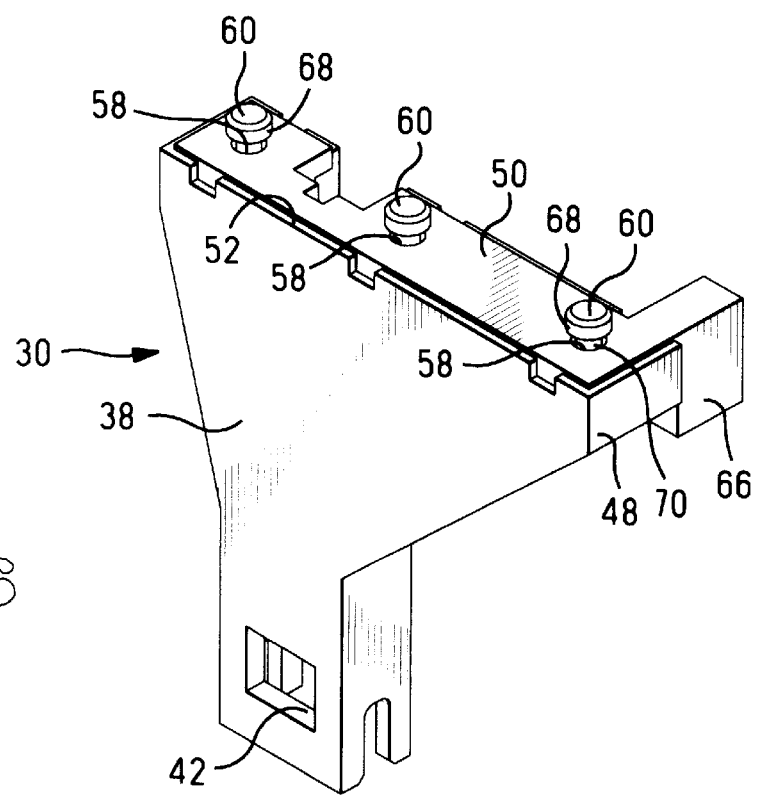
FIG. 6 is an isometric bottom view of the retention member of FIG. 5 with a resilient member assembled thereto.
Figure 7:
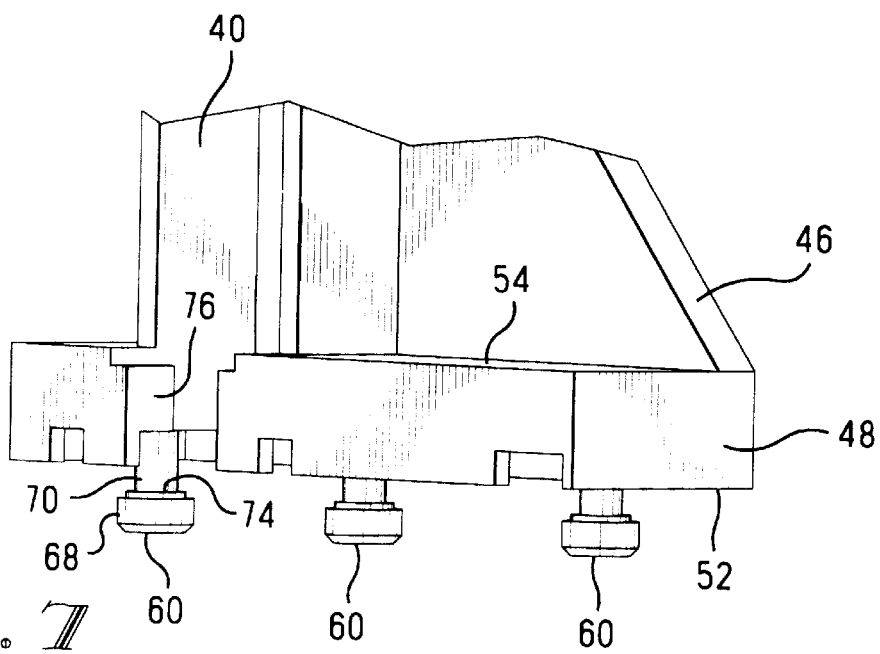
FIG. 7 is an enlarged elevation view of the board-adjacent portion of a retention member of FIGS. 1 to 6.

Each retention member 28 includes a buttress section 46 that is associated with heat sink 12 and extends along board 20 to an end 48 proximate to distal end 16 of heat sink 12. Referring to FIGS. 2 to 6, retention assemblies 32 include resilient members 50 disposed along board-adjacent faces 52 of bases 54 of retention members 38, preferably partially in pockets 56 (FIG. 5). Resilient members 50 include holes 58 spaced therealong through which extend fastening embossments 60 (FIGS. 5 to 8) that depend from board-adjacent faces 52 of bases 54, to pass through holes 24 of board 20 for mounting of retention assemblies 32 to the board.

Each resilient member 50 includes a module-engaging section 62 extending upwardly from body section 64, to seat within the bottom end of guide channel 40 of retention member 38, along an end 34 of receptacle connector 36. The upper ends of module-engaging sections 62 are abutted by leading end 22 of processor module 10 upon full insertion along guide channels 40 and latching of latch projections 18 in openings 42; the resilient members at module-engaging sections 62 are compressed toward and against circuit board 20 by module 10, thus eliminating the looseness between the module and the retention system and absorbing the tolerances, and thereby stabilizing the module for assured optimum module performance.

Each resilient member 50 also includes a heat sink engaging section 66 that protrudes upwardly adjacent end 48 of buttress section 46 of the retention member. Heat sink engaging section 66 is abutted and compressed by distal end 16 of heat sink 12 upon full insertion of the processor module 10 into retention members 38, thus assisting module-engaging section 62 in absorbing looseness to stabilize the module.

Figure 2:
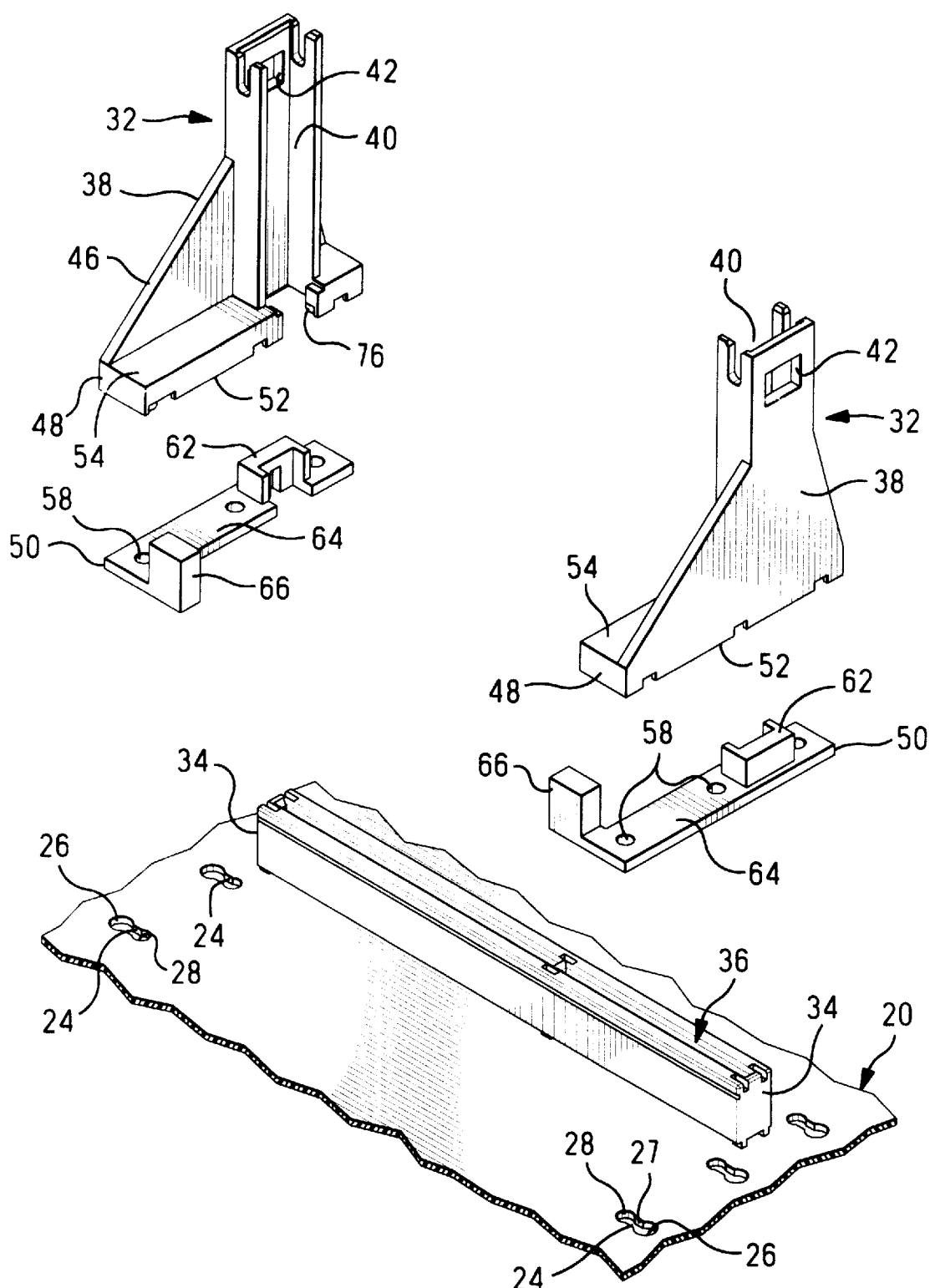
FIG. 2 is an isometric view of the retention members and resilient members exploded above the ends of the receptacle connector of FIG. 1.
Figure 3:
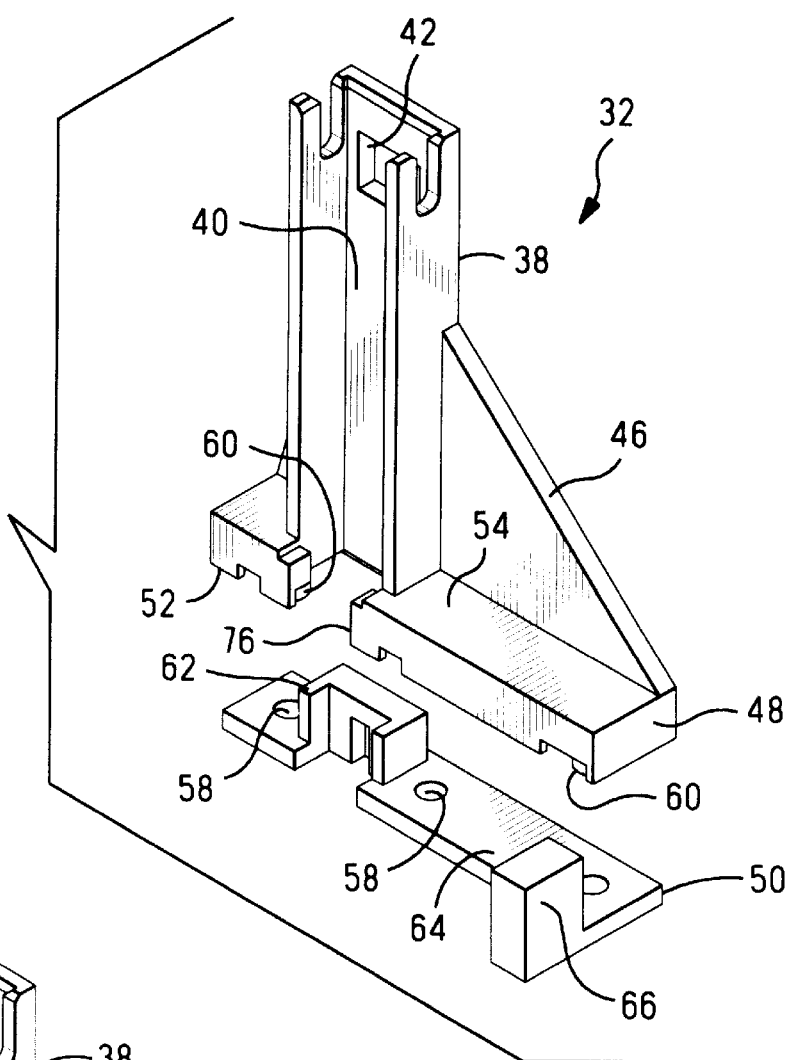
FIGS. 3 and 4 are isometric views of a retention member of FIGS. 1 and 2 and a resilient member exploded therefrom and assembled thereto respectively.
Figure 4:
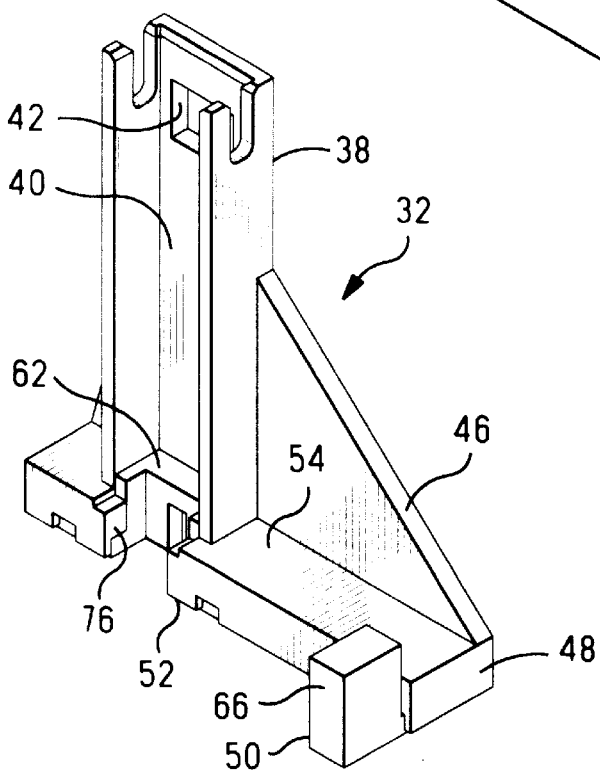

As seen in FIG. 2, mounting holes 24 of circuit board 20 are keyhole-shaped, having a large diameter end portion 26 and a small diameter end portion 28 with a narrow slot 27 communicating therebetween, with the keyhole-shaped mounting holes being oriented parallel to the receptacle connector 36. Now referring to FIGS. 5 to 8, embossments 60 include enlarged heads 68 at ends of smaller diameter shafts 70, that depend beyond the lower surface of the resilient member 50 after passing through holes 58 having a diameter small than heads 68. Heads 68 would be inserted through large diameter end portions 26 of mounting holes 24, whereafter the retention assembly would be translated toward the associated end 34 of receptacle connector 36 to receive the connector end 34 into a recess 76 at the base of guide channel 40. During translation, shafts 70 would fist pass through narrow slots 27 to enter the small diameter end portions 28, with heads 68 defining an upwardly facing ledge for self-securing beneath the lower surface of the circuit board adjacent the mounting holes 24, extending along the peripheral portions of the board surrounding small diameter end portions 28 of mounting holes 24.

Alternatively, the keyhole-shaped mounting holes could be oriented orthogonal to the receptacle connector; with a wider connector-receiving recess at the base of the guide channels of the retention members, and with the module-engaging section 62 having at least one of the side wall portions removed, the retention assemblies may be moved into the board-mounted position by being translated orthogonally with respect to the receptacle connector.

Figure 8:
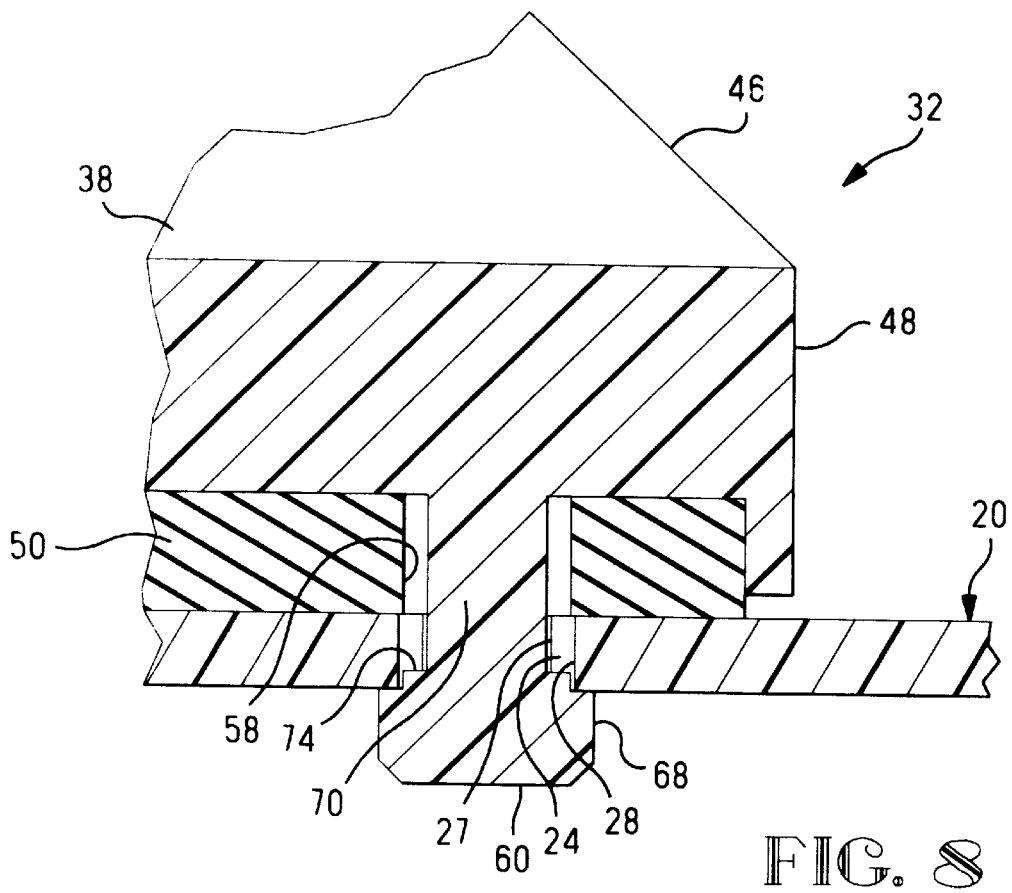
FIG. 8 is an enlarged cross-sectional view of a board-fastening portion of the assembly of FIG. 7.

Body section 64 of resilient members 50 have a height (or thickness) slightly greater than the depth of pocket 56 so that a lower portion extends below the board-adjacent face 52 of base 54 of retention member 38, and preferably are slightly compressed to have a snug fit within pocket 56. Upon mounting of retention assemblies 32 to circuit board 20, resilient members 50 are slightly compressed when heads 68 engage the lower surface of circuit board 20, as seen in FIG. 8.

Preferably heads 68 also each include a stepped section 74 that seats within small diameter end portion 28 of a mounting hole 24 to stabilize the location of embossments 60 with respect to the circuit board. Because stepped section 74 is wider than the diameter of narrow slot 27, the resilient member must be further compressed while translating the retention assembly toward the associated end 34 of connector 36 after which some compression will be relaxed as the stepped section 74 rises upwardly to seat within small diameter end portion 28 of mounting hole 24. This arrangement prevents inadvertent translation of the retention assembly away from end 34 of connector 36 and the end of the module.

In the present invention, the retention members of relatively rigid material include integral buttress sections and integral fastening sections, and the resilient members are easily secured along bases thereof, and the assemblies are easily mounted to the circuit board adjacent to ends of the receptacle connector. The retention assemblies thus have only four parts easily assembled into two units that are easily handled and mounted, that provide for retention of a processor module in mated condition with a receptacle connector and also provide for stabilization of the module with its massive heat sink extending from one side thereof, by absorbing all looseness in the arrangement.

The retention members 38 may be molded from a thermoplastic material such as polycarbonate, while the resilient members 50 may be formed from an elastomeric material such as foam rubber or rubber such as from Buna-N nitrile resin, ASTM-NBR.

Variations and modifications may occur to the specific embodiment of the invention described herein, that are within the spirit of the invention and the scope of the claims.

What is claimed is:

1. A retention system for securing a processor module to a circuit board-mounted connector where the processor module includes a heat sink extending from a side surface of the processor module to a distal end, the retention system comprising:

retention members disposed on said board at opposed ends of said board-mounted connector, said retention members defining therebetween a module-receiving channel extending to said connector;

said retention members each include an extended portion extending laterally along said circuit board; and a resilient member disposed proximate an end of each extended portion abutted by distal ends of a heat sink attached to a processor module inserted within the module-receiving channel.

2. The retention system as set forth in claim 1 wherein each said retention member is integral with a respective said extended portion and is adapted to be mounted to said circuit board.

3. The retention system as set forth in claim 2 wherein said retention member includes a buttress section extending between said extended portion and an upright portion of said retention member.

4. The retention system as set forth in claim 2 wherein the resilient member is partially disposed along a board-adjacent face of the retention member.

5. The retention system as set forth in claim 4 wherein said resilient member includes a module-engaging portion in said module-receiving channel for abutment by a leading end of a processor module.

6. The retention system as set forth in claim 2 wherein said retention member has a board-adjacent face having a plurality of embossments depending therefrom for insertion into respective mounting holes of a circuit board.

7. The retention system as set forth in claim 6 wherein each said embossment includes an enlarged head at an end of a smaller diameter shaft, whereby said enlarged head is insertable through a larger diameter end portion of said mounting hole, and said smaller diameter shaft is translatable along a slot portion of said mounting hole until said enlarged head is seated beneath a smaller diameter end portion of said mounting hole as said retention member is translated toward said connector.

8. The reaction system as set forth in claim 7 wherein the resilient member includes a module-engaging portion in said module-receiving channel for abutment with a leading end of a module.

9. The retention system as set forth in claim 8 wherein said resilient member is received into a pocket along said board-adjacent face, and includes holes spaced therealong through which extend respective said embossments.

10. The retention system as set forth in claim 8 wherein said resilient member protrudes beneath said board-adjacent face to abut said circuit board upon mounting of said retention member to said circuit board.

11. The retention system as set forth in claim 10 wherein each said enlarged head includes a stepped section that seats within the smaller diameter end portion of said mounting hole, with said resilient member being compressed against said board upon mounting the retention member to the circuit board.

12. A retention system for securing processor modules to circuit board-mounted connectors, comprising:

retention members disposed on said board at opposed ends of a board-mounted connector, said retention members defining therebetween a module-receiving channel extending to said connector;

said retention members defining a board-adjacent face having a plurality of embossments depending therefrom inserted into respective mounting holes of a circuit board, each said embossment including an enlarged head at an end of a smaller diameter shaft, whereby said enlarged head is insertable through a larger diameter end portion of each said mounting hole, and said smaller diameter shaft is translatable along a slot portion of each said mounting hole until said enlarged head is seated beneath a smaller diameter end portion of said mounting hole as said retention member is translated toward said connector;

resilient members being secured adjacent inner ends of said retention members at opposed ends of said connector in said module-receiving channel for abutment with a leading end of a module, each said resilient member protruding beneath said board-adjacent face and abuts said circuit board; and each said enlarged head including a stepped section that seats within the smaller diameter end portion of said mounting hole, with said resilient member being compressed against said board to retain said stepped section in said mounting hole.

* * * * *